US006943302B2

(12) United States Patent
Kageyama et al.

(10) Patent No.: US 6,943,302 B2
(45) Date of Patent: Sep. 13, 2005

(54) FLEXIBLE PRINTED CIRCUIT BOARD

(75) Inventors: Teruyoshi Kageyama, Ashikaga (JP);
Shinya Okino, Ashikaga (JP); Mamoru Ito, Ashikaga (JP)

(73) Assignee: Achilles Corporation, Tokyo (JP)

(*) Notice: Subject to any disclaimer, the term of this patent is extended or adjusted under 35 U.S.C. 154(b) by 0 days.

(21) Appl. No.: 10/329,557

(22) Filed: Dec. 27, 2002

(65) Prior Publication Data

US 2003/0151902 A1 Aug. 14, 2003

(30) Foreign Application Priority Data

| Jan. 7, 2002 | (JP) | 2002-000624 |
| Jan. 7, 2002 | (JP) | 2002-000623 |
| Nov. 1, 2002 | (JP) | 2002-319867 |

(51) Int. Cl.$^7$ ................................................ H05K 1/00
(52) U.S. Cl. .................... 174/254; 361/749; 360/324.5; 360/245.8; 360/234.6
(58) Field of Search ................................ 361/749–751, 361/760, 789, 795; 174/254, 117 F, 117 FF, 256, 72 A; 310/67 R; 360/97.01, 97.02, 97.03, 234.5–6, 245.8, 244.3; 257/737

(56) References Cited

U.S. PATENT DOCUMENTS

| 5,296,651 A | * | 3/1994 | Gurrie et al. ............... 174/254 |
| 5,737,837 A | * | 4/1998 | Inaba ........................... 29/884 |
| 5,821,494 A | * | 10/1998 | Albrecht et al. ........ 219/121.64 |
| 5,857,257 A | * | 1/1999 | Inaba ....................... 29/603.04 |
| 6,025,988 A | * | 2/2000 | Yan ............................. 361/685 |
| 6,341,415 B2 | * | 1/2002 | Amemiya et al. ........ 29/603.06 |
| 6,500,011 B1 | * | 12/2002 | Fujita et al. .................. 439/82 |

FOREIGN PATENT DOCUMENTS

| JP | A 11-250433 | 9/1999 |
| JP | A 11-250434 | 9/1999 |
| JP | 11250434 | * 9/1999 |

* cited by examiner

*Primary Examiner*—Kamand Cuneo
*Assistant Examiner*—Thanh S. Phan
(74) *Attorney, Agent, or Firm*—Oliff & Berridge, PLC

(57) ABSTRACT

A flexible printed circuit board of the present invention directly relays connecting portions of a magnetic head placed on a suspension to connecting portions of a base end of a carriage arm in a head suspension assembly of a magnetic disk apparatus. The flexible printed circuit board includes a laminate composed of at least a base layer, a plurality of conductive circuits formed on the base layer, a cover layer covering the conductive circuits, and a conductive polymer layer formed in the insulating material portion in the surface of the laminate. The flexible printed circuit board includes a stainless layer below the base layer or on a lower side of the conductive polymer layer on the base layer side. More preferably, in the magnetic head connecting portion, the cover layer is not formed, and on the base layer in the magnetic head connecting portion, a conductive polymer layer is formed, whereas on the plurality of conductive circuits in the magnetic head connecting portion, the conductive polymer layer is not present or is substantially absent, if any, to such a degree as to allow the magnetic head to be electrically connected to the conductive circuits.

11 Claims, 2 Drawing Sheets

FLEXIBLE PRINTED CIRCUIT BOARD

BACKGROUND OF THE INVENTION

1. Field of the Invention

The present invention relates to a flexible printed circuit board used for a head suspension assembly of a magnetic disk apparatus. More specifically, the present invention relates to a flexible printed circuit board capable of sufficiently preventing electrostatic discharge of a magnetic head even when a head suspension assembly is configured using a magnetic head with high performance.

2. Description of the Related Art

A magnetic disk apparatus widely used as a storage apparatus for a computer generally includes, as main components, a magnetic disk that is a recording medium, a spindle motor for rotating the magnetic disk, a head suspension assembly including a magnetic head, a carriage arm for supporting the head suspension assembly, a servo apparatus for moving the carriage arm, and a substrate unit for processing an electric signal. The head suspension assembly is composed of a magnetic head for recording/reproducing information, a suspension for placing the magnetic head, and a flexible printed circuit board connected to the suspension at one end and connected to the substrate unit at the other end. In this case, generally, the magnetic head is relayed to a connecting portion of a base end of the carriage arm by connecting the magnetic head to a side end of the suspension of the flexible printed circuit board through fixed wiring with a constitution in which a copper foil layer is interposed between polyimide layers, and connecting the side end of the suspension of the flexible printed circuit board to the substrate unit through the flexible printed circuit board.

The head suspension assembly with the above-mentioned constitution has a problem of ESD (electrostatic discharge) of the magnetic head. In particular, the flexible printed circuit board is covered with an insulating material such as plastic resin for the purpose of insulating a conductive circuit formed therein. Therefore, the flexible printed circuit board is likely to be charged by applying friction generated during handling. When the magnetic head is attached to the charged flexible printed circuit board, sudden discharge directed to the magnetic head occurs to cause electrostatic discharge thereof. Examples of the electrostatic discharge include the breakdown (hard ESD) of an insulating film of the magnetic head and the deterioration (soft ESD) in performance of the magnetic head. Both of them are not preferable, and become a factor for decreasing a production yield of the head suspension assembly. Furthermore, recently, along with an increase in recording density of the magnetic disk apparatus, there is a demand for high performance of the magnetic head, in particular, an increase in a reproduction output. At present, an MR (magnetoresistive) head and a GMR (giant magnetoresistive) head are developed in accordance with the demand, and furthermore, a GMR head utilizing a specular spinvalve film capable of generating a larger reproduction output is also proposed. These high-performance magnetic heads use a very thin insulating film. Therefore, they are very sensitive to electrostatic discharge (breakdown).

However, in a conventional head suspension assembly, a magnetic head is relayed to a substrate unit with two members. Therefore, it is required to connect fixed wiring to a conductive circuit in a flexible printed circuit board by soldering or the like in the course of manufacturing of the head suspension assembly. The static electricity generated during such a connection operation may cause electrostatic discharge of an insulating film of the magnetic head.

On the other hand, an attempt is made to allow a flexible printed circuit board to have conductivity so as to prevent electrostatic discharge of a magnetic head (see JP 11-250434 A). This attempt is characterized in that the flexible printed circuit board connecting the magnetic head to the substrate unit is composed of a base layer, a conductive pattern formed on the base layer, a cover layer covering the conductive pattern, and a conductive layer formed on the cover layer. By adopting the flexible printed circuit board with such a structure, static electricity charged by friction is discharge through the conductive layer to prevent electrostatic discharge.

Furthermore, in the flexible printed circuit board, it is generally required to electrically connect four connecting terminals of a magnetic head to conductive circuits in the flexible printed circuit board with sufficient bonding strength. An example of the connection method includes bonding balls made of metal to the connecting terminals and the conductive circuits through an ultrasonic wave. According to this method, an attempt is made to form convex portions projecting in a direction connecting the connecting terminals to the conductive circuits on the surfaces of the balls, thereby preventing the rotation of the balls during connection thereof, thereby enhancing connection strength and reliability (see JP 11-250433 A).

However, even in the flexible printed circuit board with the above constitution, a plurality of conductive circuits are exposed at the magnetic head connecting portion so as to connect the connecting terminals of the magnetic head to the conductive circuits in the flexible printed circuit board. A conductive layer cannot be easily formed on the exposed conductive circuits since the conductive layer may cause a short circuit between the individual conductive circuits. When the conductive layer is formed, it prevents not only electrical connection between the magnetic head and the conductive circuits, but also mechanical connection (bonding). Furthermore, the following is considered: only the conductive circuits are masked so that the conductive layer is not formed on the surface of the conductive circuits but on the other portions. Since the conductive circuits have a very minute constitution, however, masking thereof is difficult.

SUMMARY OF THE INVENTION

Therefore, with the foregoing in mind, it is an object of the present invention to provide a flexible printed circuit board capable of preventing electrostatic discharge even in the case of using a high-performance magnetic head.

The inventors of the present invention have studied earnestly in order to solve the above-mentioned problem. As a result, the inventors found the following. By extending a flexible printed circuit board including a laminate of a stainless layer, a base layer, conductive circuits and a cover layer to an attachment portion of a magnetic head, thereby directly relaying the magnetic head to a substrate unit, and by forming a conductive polymer layer made of a conductive polymer on a lower side of the stainless layer and an upper side of the cover layer, static electricity generated by friction and the like in the course of production can be discharged through the conductive polymer layer. Furthermore, it becomes possible to omit connection between fixed wiring and the conductive circuits in the flexible printed circuit board, which is required for producing a conventional head suspension assembly. As a result, a head suspension assembly can be provided, which is capable of sufficiently suppressing the breakdown of a magnetic head due to static electricity and a decrease in performance even in the case of using a high-performance magnetic head that is weak to electrostatic discharge damage compared with a conventional magnetic head. Thus, the inventors achieved the present invention.

The present invention relates to a flexible printed circuit board that directly relays connecting portions of a magnetic head mounted on a suspension to connecting portions of a base end of a carriage arm in a head suspension assembly of a magnetic disk apparatus. The flexible printed circuit board includes: a stainless layer; a base layer formed on the stainless layer; a plurality of conductive circuits formed on the base layer; a cover layer covering the conductive circuits; and a conductive polymer layer formed on at least an upper side of the cover layer.

Furthermore, regarding a laminate in which conductive circuits are provided between a base layer and a cover layer, and a conductive polymer layer made of a conductive polymer is formed at least on a lower side of the base layer and on an upper side of the cover layer, even in an embodiment of a flexible printed circuit board in which the stainless layer is attached to the conductive polymer layer on a lower side of the base layer, the flexible printed circuit board of the present invention can be constituted. According to this embodiment, in the course of production of the flexible printed circuit board, the laminate can be treated in a form peculiar to a flexible film until the stainless layer is attached. Thus, the present invention relates to a flexible printed circuit board that directly relays connecting portions of a magnetic head mounted on a suspension to connecting portions of a base end of a carriage arm in a head suspension assembly of a magnetic disk apparatus. The flexible printed circuit board includes: a laminate composed of a base layer, a plurality of conductive circuits formed on the base layer, a cover layer covering the conductive circuits, a conductive polymer layer formed on a lower side of the base layer and on an upper side of the cover layer; and a stainless layer attached to the laminate from a lower side of the base layer.

These and other advantages of the present invention will become apparent to those skilled in the art upon reading and understanding the following detailed description with reference to the accompanying figures.

DESCRIPTION OF THE PREFERRED EMBODIMENTS

Figure 1:
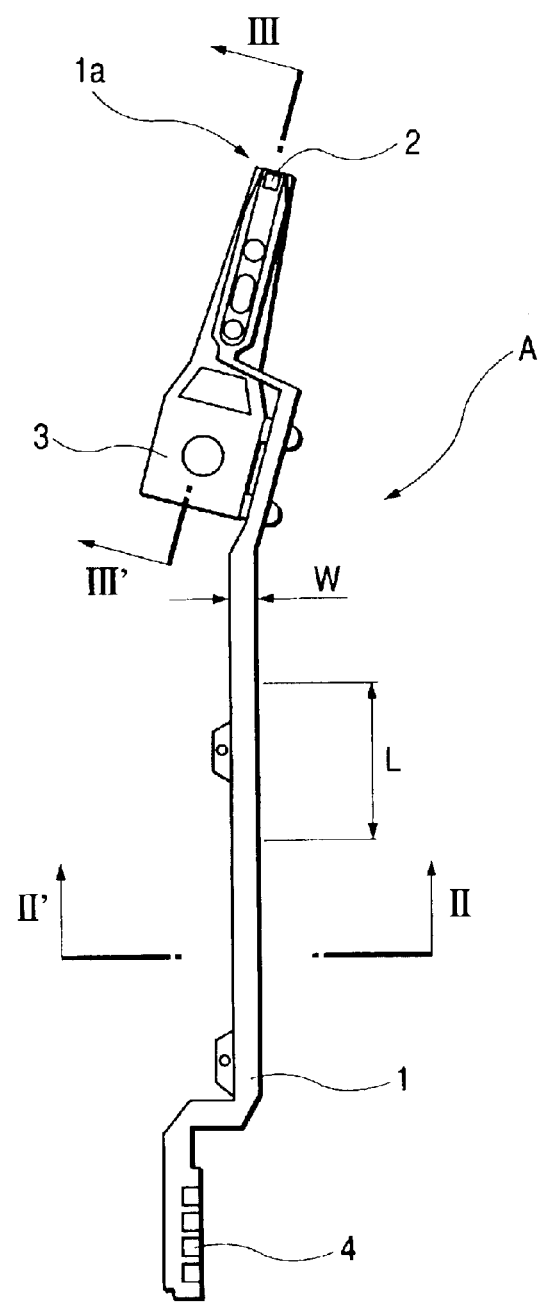
FIG. 1 is a plan view showing one embodiment of a head suspension assembly using a flexible printed circuit board according to the present invention.

When a base layer and a cover layer are made of polyimide resin or epoxy resin, and a conductive polymer layer is made of polypyrrole resin in a flexible printed circuit board, due to the high miscibility between the polyimide resin or the epoxy resin and the polypyrrole resin, the polypyrrole resin penetrates the polyimide resin or the epoxy resin during formation of a conductive polymer layer. Consequently, the adhesion of the conductive polymer layer is enhanced. Therefore, the present invention relates to a flexible printed circuit board characterized in that a base layer and a cover layer are made of polyimide resin or epoxy resin, and a conductive polymer layer is made of polypyrrole resin.

In terms of the conductivity of the flexible printed circuit board sufficient enough for discharging static electricity, the surface resistivity of the flexible printed circuit board on the cover layer side is preferably $10^5$ to $10^{11}$ Ω, more preferably $10^6$ to $10^8$ Ω. Therefore, the present invention also relates to a flexible printed circuit board characterized in that the surface resistivity thereof is $10^6$ to $10^8$ Ω.

The inventors of the present invention found that: in the case of forming a conductive layer by polymerizing a conductive polymer on the surface of the flexible printed circuit board, the adhesion of the conductive polymer is higher with respect to the base layer or the cover layer made of plastic resin, and is lower with respect to a conductive circuit made of metal. By using this property, a conductive layer having a thickness sufficient enough for discharging static electricity is formed on insulating layers such as the base layer, the cover layer, and the like, and is not formed on a metal layer such as a conductive circuit or is formed thereon so as to be dropped off, whereby the conductive layer is absent or is substantially absent on the metal layer. Consequently, connecting terminals of a magnetic head can be electrically connected to the conductive circuits, and a short circuit between the individual conductive circuits is prevented. Thus, the present invention relates to a flexible printed circuit board characterized in that a cover layer is not formed in a magnetic head connecting portion, a conductive polymer layer is formed on a base layer in the magnetic head connecting portion, and the conductive polymer layer is completely absent on the surface of a plurality of conductive circuits in the magnetic head connecting portion, or even if present, the conductive polymer layer is substantially present to such a degree that the magnetic head is electrically connected to the conductive circuits.

In the flexible printed circuit board of the present invention, when a conductive polymer layer having a thickness of 0.05 μm or less is formed on the cover layer, a conductive polymer is apt to be not present on the surface of the conductive circuits in the magnetic head connecting portion or is apt to be in a state that the conductive polymer is dotted thereon. As a result, the connecting terminals of the magnetic head can be electrically connected to the conductive circuits. Therefore, the present invention relates to a flexible printed circuit board characterized in that the conductive polymer layer formed on the cover layer has a thickness of 0.05 μm or less, and to the flexible printed circuit board characterized in that the conductive polymer is dotted on the surface of the conductive circuits in the magnetic head connecting portion. It is preferable that the thickness of the conductive polymer layer formed on the cover layer is set to be 0.01 μm or more so as to efficiently discharge static electricity.

In the flexible printed circuit board of the present invention, the conductive polymer layer is completely absent on the surface of the conductive circuits in the magnetic head connecting portion, or even if present, the conductive polymer layer is not present over the entire surface. Therefore, for example, by ultrasonically bonding balls made of gold to conductive circuits whose surfaces are made of gold, the balls can be electrically connected to the conductive circuits. Thus, the present invention also relates to a flexible printed circuit board characterized in that an upper surface of a conductive circuit is made of a thin film of gold, and a magnetic head is electrically connected to the conductive circuit by ultrasonically bonding balls made of gold to the magnetic head and the conductive circuits.

The conductive polymer layer is preferably formed on the flexible printed circuit board of the present invention as follows: a laminate (substrate body) composed of at least a base layer, a plurality of conductive circuits formed on the base layer, and a cover layer formed on the base layer and the conductive circuits, excluding a magnetic head connecting portion, is soaked in a treatment liquid containing pyrrole and an oxidation polymerizing agent, and the pyrrole is polymerized to form an electron conjugated polymer on the flexible printed circuit board. Therefore, the present invention also relates to a method for producing a flexible printed circuit board, characterized by including soaking a substrate body composed of at least a stainless layer, a base layer formed on the stainless layer, a plurality of conductive circuits formed on the base layer, and a cover layer formed on the base layer and the conductive circuits, excluding a magnetic head connecting portion, in a treatment liquid containing pyrrole and an oxidation polymerizing agent, followed by polymerization of the pyrrole, so as to form a conductive polymer layer. The present invention also relates to a method for producing a flexible printed circuit board, including soaking a substrate body composed of at least a base layer, a plurality of conductive circuits formed on the base layer, and a cover layer formed on the base layer and the conductive circuits, excluding a magnetic head connecting portion, in a treatment liquid containing pyrrole and an oxidation polymerizing agent, followed by polymerization of the pyrrole, so as to form a conductive polymer layer to obtain a laminate, and attaching the laminate to a stainless layer.

In the flexible printed circuit board of the present invention, as described above, the adhesion of the conductive polymer is higher with respect to the base layer or the cover layer and is lower with respect to conductive circuits. Therefore, even if the conductive polymer layer is formed on the surface of the conductive circuits, only the conductive polymer layer formed on the surface of the conductive circuits can be dropped off by ultrasonic washing. Therefore, the present invention also relates to a method for producing a flexible printed circuit board charactrized in that a conductive polymer formed on a surface of a conductive circuit in a magnetic head connecting portion is removed by ultrasonic washing.

It is preferable that an epoxy adhesive is used for attachment. Thus, the present invention also relates to a method for producing a flexible printed circuit board, characterized in that epoxy adhesive is used for attachment.

In the flexible printed circuit board of the present invention, a conductive polymer layer is provided on two surfaces on upper and lower sides of a substrate body, whereby static electricity generated by friction is discharged rapidly to reduce a charging potential. Furthermore, in the conventional head suspension assembly, the magnetic head is relayed to the substrate unit with two members: fixed wiring and a flexible printed circuit board. In contrast, the flexible printed circuit board of the present invention is extended to the magnetic head, thereby directly relaying the magnetic head to the substrate unit. Therefore, a connection operation between the fixed wiring and the conductive circuits in the flexible printed circuit board, which causes static electricity, becomes unnecessary. Furthermore, on the surface of the conductive circuits in the magnetic head connecting portion, a conductive polymer is not present or substantially absent to such a degree that the magnetic head can be connected to the conductive circuit electrically and mechanically. On the base layer of the magnetic head connecting portion, a conductive polymer layer with a sufficient thickness is present. As a result, in the head suspension assembly using the flexible printed circuit board of the present invention, even in the case where a high-performance magnetic head that is very sensitive to electrostatic discharge is used, the breakdown of the insulating film of the magnetic head and the deterioration of the performance of the magnetic head can be suppressed sufficiently.

Figure 2:
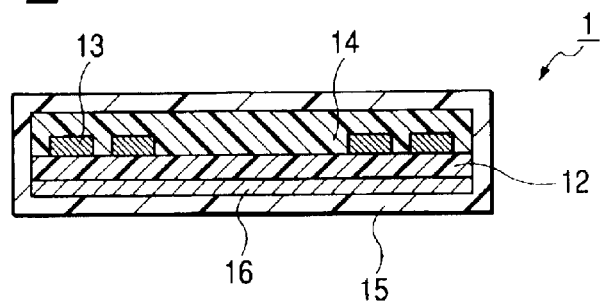
FIG. 2 is a cross-sectional view of a flexible printed circuit board of an embodiment according to the present invention taken along a line II–II' in FIG. 1.

Hereinafter, the present invention will be described in detail with reference to the drawings. FIG. 1 is a plan view showing one embodiment of a head suspension assembly using the flexible printed circuit board of the present invention. FIG. 2 is a cross-sectional view of an embodiment taken along a line II–II' in FIG. 1.

A head suspension assembly A using the flexible printed circuit board 1 of the present invention is composed of a flexible printed circuit board 1, a magnetic head 2, and a suspension 3. Furthermore, at an end of the flexible printed circuit board 1 opposite to the side where the flexible printed circuit board 1 is in contact with the magnetic head 2, a base end connecting portion 4 is provided. The base end connecting portion 4 is to be connected to a substrate unit for processing a signal for recording/reproducing by the magnetic head 2. In a magnetic disk apparatus, the entire head suspension assembly A is supported by a carriage arm.

The flexible printed circuit board 1 of the present invention is in an elongated shape as a whole, and extends to the magnetic head 2 along the suspension 3. This constitution is substantially different from that of the conventional head suspension assembly in which a relay flexible printed circuit board is provided only up to a portion where the relay flexible printed circuit board is in contact with a suspension.

The magnetic head 2 reproduces information from a magnetic disk and records information onto the magnetic disk in a magnetic disk apparatus. The magnetic head 2 generally has four connecting terminals 21. Typical examples of the magnetic head 2 include an MR head, a GMR head, and a GMR head using a specular spinvalve film.

The suspension 3 is a deformable plate member that supports the magnetic head 2 at its end, and is generally made of a metal plate having a thickness of about 60 to 70 $\mu$m. During the operation of the magnetic disk apparatus, the magnetic head 2 floats from a magnetic disk at a predetermined interval, and records/reproduces information in a non-contact state with the magnetic disk. Due to the deformability of the suspension 3, an interval at which the magnetic head 2 floats can be maintained at a predetermined value.

The flexible printed circuit board 1 is directly connected to the magnetic head 2 at one end, and the base end connecting portion 4 is provided at the other end. Since the flexible printed circuit board 1 directly relays the magnetic head 2 to the substrate unit, fixed wiring and a relay flexible printed circuit board in the conventional head suspension assembly can be replaced by one member. Thus, by using the flexible printed circuit board 1 of the present invention, the connection between the fixed wiring and the conductive circuits in the relay flexible printed circuit board, which is indispensable for producing a conventional head suspension assembly, can be omitted.

The flexible printed circuit board 1 of the present invention shown in FIG. 2 is composed of a substrate body comprising a base layer 12, conductive circuits 13, a cover layer 14 and a stainless layer 16, and of a conductive polymer layer 15 formed on the entire periphery including the lower side of the stainless layer 16 and the upper side of the cover layer 14.

Here, as described above, due to the difference in the adherence of the conductive polymer, there may be a case where no conductive polymer layer is formed on the stainless layer. However, the stainless layer itself has a satisfactory conductivity and thus a problem concerning electrostatic discharge does not occur.

The base layer 12 is formed of a non-conductive material on the stainless layer 16 in a general flexible printed circuit board. Examples of the material include polyvinyl chloride, polystyrene, polymethylmethacrylate, polycarbonate, polyethylene terephthalate, polyethylene, polypropylene, polyvinylidene chloride, polyvinylidene fluoride, polyimide, polyetherimide, polyether sulphone, polyether ketone, polysulphone, polyacrylate, epoxy resin, and the like.

The conductive circuit 13 is made of, for example, copper, and is plated with gold so as to facilitate ultrasonic bonding. The number of the conductive circuits 13 is four, in accordance with the number of connecting terminals 21 provided in the magnetic head 2.

The cover layer 14 is formed on the base layer 12 after the conductive circuits 13 are formed, in order to prevent the conductive circuits 13 from being exposed to air to cause oxidation and corrosion, and to accurately insulate the individual conductive circuits 13. The cover layer 14 is also made of a non-conductive material used in a general flexible printed board. Examples of the material are the same as those for the base layer 12.

The conductive polymer layer 15 surrounds the entire periphery of the laminate composed of the base layer 12, the conductive circuits 13, the cover layer 14, and the stainless layer 16, including the lower side of the stainless layer 16 and the upper side of the cover layer 14. The conductive polymer layer 15 is made of an electron conjugated polymer having conductivity. For example, the conductive polymer layer 15 is formed by polymerizing a monomer having a conjugated double-bond in a molecular structure and is polymerizable by oxidation. A typical example of the monomer includes a 5-membered complex cyclic compound. Pyrrole, thiophene, furan, indole, or a derivative thereof, for example, N-methyl indole, 3-methyl thiophene, 3-methyl furan, 3-methyl indole, and the like are preferable. The conductive polymer layer 15 is formed of a conductive polymer, and contains no ionic material with a low molecular weight. Therefore, an ionic material is unlikely to penetrate the base layer 12, the cover layer 14, and the like to contaminate them, and furthermore, sufficient conductivity can be exhibited even at a low humidity.

The thickness of the conductive polymer layer 15 is preferably in a range of 0.01 to 0.1 $\mu$m, more preferably in a range of 0.03 to 0.05 $\mu$m. It is also preferable to form the conductive polymer layer 15 so that the surface resistivity of the flexible printed circuit board 1 is in a range of $10^5$ to $10^{11}$ $\Omega$, particularly, in a range of $10^6$ to $10^8$ $\Omega$.

The stainless layer 16 is made of a thin stainless foil, and is provided for the purpose of giving predetermined strength to the flexible printed circuit board. The thickness thereof is about 40 to 50 $\mu$m, which is smaller than that of a metal plate used in the suspension 3.

When the materials for the base layer 12 and the cover layer 14 and the material for the conductive polymer layer 15 are selected so that the combination thereof exhibits large miscibility, the material for the conductive polymer layer 15 penetrates the base layer 12 and the cover layer 14 during formation of the conductive polymer layer 15. As a result, the adhesion of the conductive polymer layer 15 is enhanced. As the combination of materials capable of achieving this effect, the following is considered: polyimide or epoxy is selected as a material for the base layer 12 and the cover layer 14, and polypyrrole is selected as the material for the conductive polymer layer 15.

Figure 3:
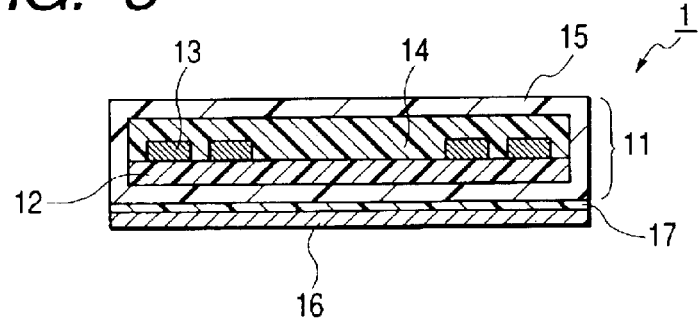
FIG. 3 is a cross-sectional view of a flexible printed circuit board of another embodiment according to the present invention taken along the line II–II' in FIG. 1.

On the other hand, the flexible printed circuit board 1 of the present invention in accordance with an embodiment shown in FIG. 3 is characterized in that, a laminate 11 composed of the base layer 12, the conductive circuits 13, the cover layer 14, and the conductive polymer layer 15 formed on the entire periphery including the lower side of the base layer 12 and the upper side of the cover layer 14 is provided with the stainless layer 16 attached via an adhesive 17 from a lower side of the base layer 12. The base layer 12, the conductive circuits 13, the cover layer 14, the conductive polymer layer 15, and the stainless layer 16 are as described above. As the adhesive 17 used for attaching the stainless layer 16 to the laminate 11, any kind can be used unless they adversely influence each layer constituting the flexible printed circuit board 1. In particular, an epoxy adhesive is preferable.

Figure 4:
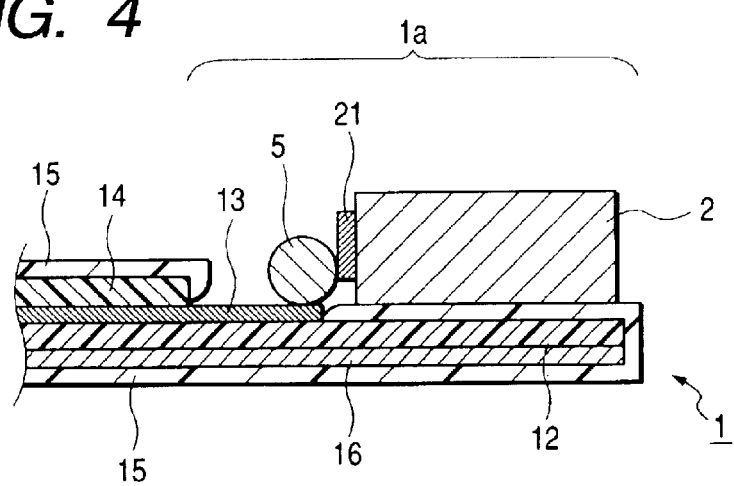
FIG. 4 is a cross-sectional view of a flexible printed circuit board of the embodiment shown in FIG. 2 according to the present invention taken along a line III–III' in FIG. 1.

As shown in FIG. 4, the flexible printed circuit board 1 includes the conductive polymer layer 15 formed on the entire periphery of the substrate body, excluding the surface of a conductive circuit 13 in a magnetic head connecting portion 1a. The cover layer 14 is not present in the magnetic head connecting portion 1a. Furthermore, the conductive circuit 13 extends to the vicinity of the connecting. terminal 21 of the magnetic head 2. In this portion, the conductive polymer layer 15 is directly formed on an upper surface of the base layer 12.

In the magnetic head connecting portion 1a, the conductive polymer layer 15 on the base layer 12 has a large resistance value sufficient enough for insulating each conductive circuit 13. On the surface of the conductive circuit 13, the conductive polymer layer 15 is not present so as to electrically connect the magnetic head 2 to the conductive circuit 13. That is, due to the difference in adhesion of the conductive polymer during formation of the conductive polymer layer 15, even if the conductive polymer layer 15 is formed on the base layer 12 and the cover layer 14, the conductive polymer is not present on the surface of the conductive circuit 13 of the magnetic head connecting portion 1a, or is substantially absent (e.g., dotted in a patchy shape, a band shape, a net shape) to such a degree of mechanically and electrically connecting the connecting terminal 21 to the conductive circuit 13. (In FIG. 4, the conductive polymer is not shown on the surface of the conductive circuit 13.) In particular, this tendency becomes conspicuous under the condition that the conductive polymer layer 15 having a thickness of 0.05 $\mu$m or less is formed on the cover layer 14, and the conductive polymer layer 15 is hardly present on the surface of the conductive circuit 13. More specifically, the conductive circuit 13 is exposed, whereby the conductive circuit 13 is strongly bonded to the ball 5 made of metal by ultrasonic bonding.

As shown in FIG. 4, in the flexible printed circuit board 1 of the present invention, the magnetic head 2 can be electrically connected to the conductive circuit 13 via the ball 5 made of gold that is ultrasonically bonded to the connecting terminal 21 and the conductive circuit 13.

Furthermore, in the flexible printed circuit board 1 of the present invention, the conductive polymer layer 15 is provided on the base layer 12 of the magnetic head connecting portion 1*a*. Therefore, static electricity can be discharged easily.

The flexible printed circuit board 1 of the embodiment shown in FIG. 2 can be produced easily by forming the conductive polymer layer 15 on the surface of the previously produced substrate body composed of the base layer 12, the conductive circuits 13, the cover layer 14, and the stainless layer 16.

The production of the flexible printed circuit board 1 starts from the formation of the base layer 12 by coating the stainless layer 16 designed in a predetermined shape with, for example, polyimide varnish. Then, the conductive circuits 13 having a desired pattern are formed on the resultant base layer 12, preferably, by lithography. After the conductive circuits 13 are formed, the cover layer 14 is formed thereon. The cover layer 14 can be formed by a simple method such as coating and drying. However, in the case where the cover layer 14 plays a role of a solder resist, and is formed only in a particular region excluding a portion to be a connecting portion, and the like, the cover layer 14 is formed by lithography. In the course of these operations, it is possible to appropriately conduct gold plating.

The conductive polymer layer 15 can be formed in accordance with the method described in, for example, JP 62-140313 A. According to this method, a substrate body composed of the base layer 12, the conductive circuits 13, the cover layer 14, and the stainless layer 16 is soaked in a treatment liquid containing a monomer capable of forming an electron conjugated polymer and an oxidation polymerizing agent, followed by polymerizing the monomer on the surface of the substrate body, thereby forming the conductive polymer layer 15.

In this formation method, in order to decrease the thickness of the conductive polymer layer 15, the concentration of the monomer in the treatment liquid should be maintained low, preferably, at about $5 \times 10^{-3}$ to 1 mol/L. Furthermore, in order to prevent the monomer from being rapidly polymerized to generate a polymer in a fine particle shape and prevent the polymer from becoming contaminating particles, it is preferable that the polymerization is conducted at a low reaction temperature, e.g., $-20°$ C. to $30°$ C., particularly, $0°$ C. to $20°$ C. Furthermore, in terms of formation of a more uniform conductive polymer layer 15 and enhancement of the adhesion of the conductive polymer layer 15, it is preferable to pretreat the surface of the flexible printed circuit board by corona treatment, plasma treatment, or the like before the conductive polymer layer 15 is formed.

The above-mentioned method for forming the conductive polymer layer 15 by soaking the substrate body in a treatment liquid is very suitable for producing a good product, if the conductive polymer layer 15 is provided on the entire periphery as in the flexible printed circuit board 1 of the present invention. Furthermore, this method is easier, compared with the formation method including a coating process of a monomer and a curing process of the monomer.

Furthermore, instead of forming the conductive polymer layer 15 in a treatment liquid, the entire periphery of the flexible printed circuit board 1 is brought into contact with a monomer in a vapor phase atmosphere, followed by radiating active energy, so as to form the conductive polymer layer 15

On the other hand, the flexible printed circuit board 1 of the embodiment shown in FIG. 3 can be produced by previously forming the laminate 11 composed of the base layer 12, the conductive circuits 13, the cover layer 14, and the conductive polymer layer 15, and thereafter, attaching the stainless layer 16 to the laminate 11 via the adhesive 17.

The laminate 11 can be produced by first forming the conductive circuits 13 having a desired pattern on the base layer 12, forming the cover layer 14 on the conductive circuits 13, and forming the conductive polymer layer 15, as described above. In this case, the laminate 11 does not include the stainless layer 16. Due to the absence of the stainless layer 16, which should be handled very carefully since it is easily deformable and its deformation is irreversible, the laminate 11 can be dealt with as an ordinary flexible film. That is, the laminate 11 is handled in a reel state in the same way as in an ordinary film and even if the laminate 11 is very thin, it is relatively easily handled; as a result, the productivity of the flexible printed circuit board 1 is enhanced substantially.

The stainless layer 16 is attached to the laminate 11 thus obtained from the lower side of the base layer 12 via the adhesive 17. In the production of the flexible printed circuit board 1, a stainless layer 16 previously designed in a predetermined shape is attached to the conductive polymer layer 15, whereby the stainless layer 16 is provided. Furthermore, the flexible printed circuit board may also be produced as follows: after the stainless layer 16 is attached to the laminate 11, both of them are cut out in a predetermined shape. In this case, the conductive polymer layer 15 is present only on the laminate surface of the flexible printed circuit board, and is not present on side faces.

EXAMPLES

The present invention will be described in detail by way of the following examples. The examples are provided merely for illustrative purpose, and are not intended to limit the present invention in any way.

Example 1

A stainless layer made of a stainless foil was coated with polyimide varnish to form a base layer. Four conductive circuits made of copper were formed on the base layer by lithography. A gold thin film was formed on the conductive circuits. Thereafter, a cover layer made of polyimide was formed on the base layer and the conductive circuits to produce a laminate (substrate body). The cover layer was formed by lithography, and the conductive circuits were exposed in a magnetic head connecting portion and an end to be a substrate unit side, whereby connecting portions were formed.

Then, 500 ml of a 0.1 mol/L potassium peroxydisulfate aqueous solution was placed in a 1 L glass beaker and held at $2°$ C. to $3°$ C., and the above-mentioned laminate was soaked in the solution. Thereafter, 100 ml of a 0.2 mol/L pyrrole aqueous solution was added to the potassium peroxydisulfate aqueous solution, and the resultant mixture was stirred for 10 minutes at $15°$ C. to form a conductive polymer layer. Then, the resultant laminate was ultrasonically washed with water.

The thickness of the conductive polymer layer was set to be 0.04 $\mu$m on the cover layer.

Furthermore, as shown in Test Example 4, it was confirmed that the conductive polymer layer was not present or substantially absent on the surface of the conductive circuits in the magnetic head connecting portion;

Thus, a flexible printed circuit board of the present invention having a full length of about 30 mm, a width of about 1 mm, and a thickness of about 0.5 mm was produced.

Example 2

Four conductive circuits made of copper were formed on a base layer made of polyimide by lithography. A gold thin film was formed on the conductive circuits. Thereafter, a cover layer made of polyimide was formed on the base layer and the conductive circuits to produce a laminate (substrate body). The cover layer was formed by lithography, and the conductive circuits were exposed in a magnetic head connecting portion and an end to be a substrate unit side, whereby connecting portions were formed.

Then, 500 ml of a 0.1 mol/L potassium peroxydisulfate aqueous solution was placed in a 1 L glass beaker and held at 2° C. to 3° C., and the above-mentioned laminate was soaked in the solution. Thereafter, 100 ml of a 0.2 mol/L pyrrole aqueous solution was added to the potassium peroxydisulfate aqueous solution, and the resultant mixture was stirred for 10 minutes at 15° C. to form a conductive polymer layer. Then, the resultant laminate was ultrasonically washed with water.

The thickness of the conductive polymer layer was set to be 0.04 $\mu$m on the cover layer.

A stainless foil was attached to the laminate thus obtained from the lower side of the base layer via epoxy resin.

Furthermore, as shown in Test Example 4, it was confirmed that the conductive polymer layer was not present or substantially absent on the surface of the conductive circuits in the magnetic head connecting portion.

Thus, a flexible printed circuit board of the present invention having a full length of about 30 mm, a width of about 1 mm, and a thickness of about 0.5 mm was produced.

Example 3

A flexible printed circuit board of the present invention having a full length of about 30 mm, a width of about 1 mm, and a thickness of about 0.5 mm was produced in the same way as in Example 1. The thickness of the conductive polymer layer was set to be 0.07 $\mu$m on the cover layer.

Furthermore, as shown in Test Example 4, it was confirmed that the conductive polymer layer was not present or substantially absent on the surface of the conductive circuits in the magnetic head connecting portion.

Comparative Example 1

On a base layer made of polyimide, four conductive circuits made of copper were formed by lithography. Thereafter, a cover layer made of polyimide was formed on the base layer and the conductive circuits. Lithography was used for the formation of the cover layer. The conductive circuits were exposed at both ends of the base layer to produce a laminate. A conductive polymer layer made of polypyrrole was formed on only the cover layer of the laminate, and a flexible printed circuit board with a same dimension as that in Example 1 was produced for comparison.

Comparative Example 2

The same laminate as that produced in Example 1 was used as a flexible printed circuit board without forming a conductive polymer layer.

Comparative Example 3

Both surfaces of the same laminate as that produced in Example 1 were coated with a commercially available conductive polymer coating to form a conductive polymer layer, thereby producing a flexible printed circuit board. Thereafter, the flexible printed circuit board was ultrasonically washed with water. The thickness of the conductive polymer layer was set to be 0.04 $\mu$m on the cover layer.

Furthermore, as shown in Test Example 4, the conductive polymer layer was formed over the entire surface of the conductive circuits in the magnetic head connecting portion, and its thickness was 0.04 $\mu$m.

As the conductive polymer coating, Bitron produced by Nagase Sangyo K.K. (conductive polymer type) was used.

Comparative Example 4

Both surfaces of the same laminate as that produced in Example 1 were coated with a commercially available charge antistatic agent to form a conductive polymer layer, thereby producing a flexible printed circuit board. Thereafter, the flexible printed circuit board was ultrasonically washed with water. The thickness of the antistatic layer was set to be 0.04 $\mu$m on the cover layer.

Furthermore, as shown in Test Example 4, the conductive polymer layer was formed over the entire surface of the conductive circuits in the magnetic head connecting portion, and its thickness was 0.04 $\mu$m.

As an antistatic agent, SKYLIC A produced by Achilles Corporation (cation surfactant type) was used.

Test Example 1

The flexible printed circuit boards produced in Examples 1 and 3, and Comparative Examples 1 to 4 were tested for frictional electrification.

Each flexible printed circuit board on the cover layer side was charged by applying friction three times at a distance of 2 cm with a ceramic pincette. Thereafter, the charge amount of the flexible printed circuit board was measured. The measurement was conducted with respect to 5 different samples. Table 1 shows the results thereof together with surface resistivity of respective samples on the cover layer side.

TABLE 1

| | | Results of the test for frictional electrification (20° C., 50%) | | | | | |
|---|---|---|---|---|---|---|---|
| Number of samples | | Example 1 | Example 3 | Comparative Example 1 | Comparative Example 2 | Comparative Example 3 | Comparative Example 4 |
| 1 | Charge amount | −0.02 nC | −0.02 nC | −0.07 nC | −30 nC | −0.02 nC | −0.10 nC |
|   | Resistivity | $1 \times 10^7$ Ω | $5 \times 10^5$ Ω | $2 \times 10^6$ Ω | Not measurable | $6 \times 10^6$ Ω | $7 \times 10^8$ Ω |
| 2 | Charge amount | −0.02 nC | −0.02 nC | −0.07 nC | −35 nC | −0.03 nC | −0.08 nC |

TABLE 1-continued

Results of the test for frictional electrification (20° C., 50%)

| Number of samples | | Example 1 | Example 3 | Comparative Example 1 | Comparative Example 2 | Comparative Example 3 | Comparative Example 4 |
|---|---|---|---|---|---|---|---|
| 3 | Resistivity | $2 \times 10^7 \; \Omega$ | $3 \times 10^5 \; \Omega$ | $3 \times 10^5 \; \Omega$ | Not measurable | $9 \times 10^6 \; \Omega$ | $6 \times 10^8 \; \Omega$ |
|   | Charge amount | −0.03 nC | −0.02 nC | −0.06 nC | −32 nC | −0.02 nC | −0.09 nC |
| 4 | Resistivity | $3 \times 10^7 \; \Omega$ | $6 \times 10^5 \; \Omega$ | $5 \times 10^6 \; \Omega$ | Not measurable | $7 \times 10^6 \; \Omega$ | $8 \times 10^8 \; \Omega$ |
|   | Charge amount | −0.02 nC | −0.02 nC | −0.07 nC | −40 nC | −0.02 nC | −0.12 nC |
| 5 | Resistivity | $2 \times 10^7 \; \Omega$ | $3 \times 10^5 \; \Omega$ | $9 \times 10^5 \; \Omega$ | Not measurable | $6 \times 10^6 \; \Omega$ | $9 \times 10^8 \; \Omega$ |
|   | Charge amount | −0.02 nC | −0.02 nC | −0.09 nC | −28 nC | −0.02 nC | −0.10 nC |
|   | Resistivity | $2 \times 10^7 \; \Omega$ | $4 \times 10^5 \; \Omega$ | $3 \times 10^6 \; \Omega$ | Not measurable | $7 \times 10^6 \; \Omega$ | $7 \times 10^8 \; \Omega$ |

As shown in Table 1, in the Examples 1 and 3, static electricity is discharged more quickly than in Comparative Example 1. Further, in the flexible printed circuit board of Comparative Example 2, a large amount of static electricity remained since conducting processing was not performed. In Comparative Example 4, a larger amount of static electricity remained, compared with Examples 1 and 3.

A surface resistivity p was defined as:

$$\rho = R \times W/L,$$

in which a resistance in an interval L is R in a flexible printed circuit board with a width of W (see FIG. 1). In the measurement of a resistance, L was set to be 1 cm except for the case where it is not measurable.

Test Example 2

Head suspension assemblies configured by using the flexible printed circuit boards obtained in Examples 1 and 2, and Comparative Example 1 were tested for frictional electrification.

First, a resistance value and a peak current value of a magnetic head of each head suspension assembly were measured. Then, each flexible printed circuit board of the head suspension assemblies was charged by applying friction twice at a distance of 3 cm with a ceramic pincette. Thereafter, a resistance value and a peak current value of the magnetic head were measured, and compared with the values measured before charging. The measurement was conducted with respect to 5 different samples. Table 2 shows the results.

TABLE 2

Results of the test for frictional electrification

| | | Resistance of a head (Ω) | | | Peak current value (uV) | | |
|---|---|---|---|---|---|---|---|
| Sample Number | | Example 1 | Example 2 | Comparative Example 1 | Example 1 | Example 2 | Comparative Example 1 |
| 1 | Before charging | 36.45 | 36.88 | 38.20 | 2583.69 | 1652.78 | 1915.30 |
|   | After charging | 36.50 | 36.90 | 38.10 | 2587.56 | 1647.47 | 1904.55 |
| 2 | Before charging | 34.79 | 36.51 | 37.75 | 1745.12 | 2583.69 | 1868.72 |
|   | After charging | 34.81 | 36.55 | 94.10 | 1745.12 | 2588.56 | 48.97 |
| 3 | Before charging | 36.71 | 34.85 | 36.13 | 1652.66 | 1745.00 | 1715.58 |
|   | After charging | 36.80 | 34.96 | 36.13 | 1643.47 | 1746.12 | 1713.68 |
| 4 | Before charging | 35.63 | 35.63 | 35.89 | 2751.36 | 2752.56 | 1502.26 |
|   | After charging | 35.64 | 35.62 | 74.12 | 2747.63 | 2747.63 | 33.42 |
| 5 | Before charging | 35.69 | 35.41 | 34.40 | 1899.32 | 1899.32 | 1200.29 |
|   | After charging | 35.74 | 35.56 | 34.44 | 1908.85 | 1907.98 | 1041.08 |

In the head suspension assemblies using the flexible printed circuit boards of Examples 1 and 2, both the resistance value and peak current value of the magnetic head were hardly changed before and after charging, and breakdown and deterioration in performance of the magnetic head were not caused.

In contrast, in Samples 2 and 4 among the head suspension assemblies using the flexible printed circuit board of Comparative Example 1, the resistance value of the magnetic head increased remarkably, and the peak current value decreased drastically. This shows that the breakdown (hard ESD) of an insulating film of the magnetic head occurred. In Sample 5, although the resistance value of the magnetic head was not changed, the peak current value was changed significantly. This shows that the deterioration (soft ESD) of the performance of the magnetic head occurred.

Test Example 3

The flexible printed circuit boards obtained in Examples 1 and 2 were tested for adhesion of a conductive polymer layer.

First, the charge potential of each flexible printed circuit board was measured to be set as an initial potential. Then, the flexible printed circuit board was subjected to friction at predetermined times with a friction plate. Thereafter, the charge potential was measured again. The charge potential after applying friction a predetermined times was measured in the same way even in the case where the flexible printed circuit board was subjected to friction 50 times with cotton swabs impregnated with isopropanol (IP) at a time between the measurement of an initial potential and the application of friction by the friction plate. Table 3 shows the results.

TABLE 3

Results of the test for adhesion (Change of charge potential: V)

| | Number of friction | | | | | | |
|---|---|---|---|---|---|---|---|
| | 0 | 50 | 100 | 200 | 300 | 400 | 500 |
| Example 1 | | | | | | | |
| No IP application | 0 | 1 | 0 | 1 | 0 | 2 | 2 |
| IP application | −2 | 0 | −1 | −2 | −2 | −3 | −3 |
| Example 2 | | | | | | | |
| No IP application | 0 | 0 | 0 | 1 | 1 | 2 | 2 |
| IP application | −1 | 0 | 0 | −2 | −3 | −2 | −3 |

Table 3 shows that, in Examples 1 and 2, the charge potential was hardly changed after applying friction 500 times with the friction plate, irrespective of whether or not isopropanol was applied. This verifies the excellent adhesion and resistance to drug of the conductive polymer layer of the flexible printed circuit board of Example 1.

Test Example 4

The state of a conductive polymer layer on exposed conductive circuits in a magnetic head connecting portion of the respective flexible printed circuit boards produced in Examples 1 to 3 and Comparative Examples 3 and 4 was checked by using Electron Spectroscopy for Chemical Analysis. The measurement was conducted with respect to 5 different samples.

As a result, the presence of gold was confirmed in all the samples in Examples 1 to 3. It was confirmed from this result that the conductive polymer layer on the surface of the conductive circuits of all the samples in Examples 1 to 3 was not present or substantially absent.

Furthermore, in Comparative Examples 3 and 4, the presence of metal was not confirmed. The thickness of the conductive polymer layer was 0.04 μm in all the samples in Comparative Example 3, and 0.04 μm in all the samples in Comparative Example 4.

Test Example 5

A magnetic head was attached to the respective flexible printed circuit boards produced in Examples 1 and 3 and Comparative Examples 3 and 4. Thereafter, balls made of gold with a diameter of 100 μm were brought into contact with the connecting terminals made of gold of the magnetic head and the conductive polymer layer on the surfaces of the conductive circuits to perform ultrasonic bonding, whereby the connecting terminals were electrically connected to the conductive polymer layer via the balls made of gold. Five different samples were tested for the bonding state between the connecting terminals and the conductive circuits.

A force parallel to the bonding surface was applied so as to flick the balls made of gold, whereby a test for breaking bonding was conducted. Table 4 shows a peeled state between the conductive circuits and the balls made of gold.

TABLE 4

| | Example 1 | Example 3 | Comparative Example 3 | Comparative Example 4 |
|---|---|---|---|---|
| 1 | Material breakdown | Material breakdown | Interface breakdown | Interface breakdown |
| 2 | Material breakdown | Slight material breakdown | Interface breakdown | Interface breakdown |
| 3 | Material breakdown | Material breakdown | Interface breakdown | Interface breakdown |
| 4 | Material breakdown | Material breakdown | Interface breakdown | Interface breakdown |
| 5 | Material breakdown | Material breakdown | Interface breakdown | Interface breakdown |

As shown in Table 4, in Examples 1 and 3, material breakdown was exhibited, which shows sufficient bonding strength. In Comparative Examples 3 and 4, interface breakdown was exhibited, which shows insufficient bonding strength.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A flexible printed circuit board that directly relays connecting portions of a magnetic head placed on a suspension to connecting portions of a base end of a carriage arm in a head suspension assembly of a magnetic disk apparatus, wherein the flexible printed circuit board includes at least: a stainless layer; a base layer formed on the stainless layer; a plurality of conductive circuits formed on the base layer; a cover layer covering the conductive circuits; and a first conductive polymer layer portion formed at least on an upper side of the cover layer, wherein the base layer and the cover layer are made of polyimide resin or epoxy resin, and the conductive polymer layer is made of polypyrrole resin, the cover layer is not formed in the magnetic head connecting portion, and on the base layer in the magnetic head connecting portion, a second conductive polymer layer portion is formed and presents, and on the plurality of conductive circuits in the magnetic head connecting portion, the first and second conductive polymer layer portions are not present or are substantially absent, if any, to such a degree as to allow the magnetic head to be electrically connected to the conductive circuits.

2. A flexible printed circuit board according to claim 1, wherein a surface resistivity on the cover layer side is $10^6$ to $10^8 \Omega$.

3. A flexible printed circuit board according to claim 1, wherein the first conductive polymer layer portion has a thickness of 0.05 μm or less.

4. A flexible printed circuit board according to claim 1, wherein a conductive polymer is dotted on the surface of the conductive circuits in the magnetic head connecting portion.

5. A flexible printed circuit board according to claim 1, wherein an upper surface of the conductive circuits is made of a gold thin film, and the magnetic head is electrically connected to the conductive circuits by ultrasonically bonding balls made of gold to the magnetic head and the conductive circuits.

6. The flexible printed circuit board of claim 1, wherein the first conductive polymer layer portion is continuous with the second conductive polymer layer portion.

7. A flexible printed circuit board that directly relays connecting portions of a magnetic head disposed on a suspension to connecting portions of a base end of a carriage arm in a head suspension assembly of a magnetic disk apparatus, wherein the flexible printed circuit board comprises: a stainless layer, a plurality of conductive circuits formed on a base layer, a cover layer covering the conductive circuits, and a first conductive polymer layer portion formed at least on a side of the cover layer, wherein the cover layer is not formed in the magnetic head connecting portion, and on the base layer in the magnetic head connecting portion, a second conductive polymer layer portion is formed and presents, and on the plurality of conductive circuits in the magnetic head connecting portion, the first and second conductive polymer layer portions are not present or are substantially absent, if any, to such a degree as to allow the magnetic head to be electrically connected to the conductive circuits.

8. A flexible printed circuit board according to claim 7, wherein the first conductive polymer layer portion has a thickness of 0.05 μm or less.

9. A flexible printed circuit board according to claim 7, wherein a conductive polymer is dotted on the surface of the conductive circuits in the magnetic head connecting portion.

10. A flexible printed circuit board according to claim 7, wherein an upper surface of the conductive circuits is made of a gold thin film, and the magnetic head is electrically connected to the conductive circuits by ultrasonically bonding balls made of gold to the magnetic head and the conductive circuits.

11. The flexible printed circuit board of claim 7, wherein the first conductive polymer layer portion is continuous with the second conductive polymer layer portion.

* * * * *